(12) United States Patent
Makiyama

(10) Patent No.: US 7,319,070 B2
(45) Date of Patent: Jan. 15, 2008

(54) SEMICONDUCTOR DEVICE FABRICATION METHOD

(75) Inventor: Kozo Makiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 288 days.

(21) Appl. No.: 11/244,072

(22) Filed: Oct. 6, 2005

(65) Prior Publication Data
US 2006/0223294 A1 Oct. 5, 2006

(30) Foreign Application Priority Data
Mar. 31, 2005 (JP) .............................. 2005-105227

(51) Int. Cl.
*H01L 21/44* (2006.01)
(52) U.S. Cl. ............... 438/670; 438/671; 257/E21.259
(58) Field of Classification Search ................ 438/670, 438/671, 780, 281
See application file for complete search history.

(56) References Cited

U.S. PATENT DOCUMENTS 6,555,607 B1 * 4/2003 Kanda et al. ............... 524/366
6,579,657 B1 * 6/2003 Ishibashi et al. .......... 430/270.1
6,663,761 B2 * 12/2003 Kamijima ................... 205/122
2006/0160015 A1 * 7/2006 Takano et al. ........... 430/270.1

FOREIGN PATENT DOCUMENTS

JP 6-5631 1/1994
JP 8-272107 10/1996

* cited by examiner

*Primary Examiner*—Alexander Ghyka
(74) *Attorney, Agent, or Firm*—Kratz, Quintos & Hanson, LLP

(57) ABSTRACT

In a conductive layer fabrication method, a lower resist layer (210) is formed on a semiconductor substrate. A water soluble resin layer (212) is formed over the lower resist layer. Heat treatment is performed so as to produce a cross-linking layer (211) between the lower resist layer and the water soluble resin layer, the cross-linking layer being insoluble in an organic material. A resist containing a photosensitizing agent is applied to form an upper resist layer (214) over the cross-linking layer. The upper and lower resist layers are irradiated by a beam through a photomask. A portion of the upper resist layer and a portion of the cross-linking layer are removed through development to form an upper opening. A portion of the lower resist layer is removed using a developer to form a lower opening. Then a conductive layer (302) is formed on the semiconductor substrate through the upper and lower openings.

15 Claims, 8 Drawing Sheets

SEMICONDUCTOR DEVICE FABRICATION METHOD

BACKGROUND OF THE INVENTION

1. Field of the Invention

The present invention generally relates to a semiconductor device fabrication method, and more particularly, to a method for forming a conductive layer on the surface of a compound semiconductor substrate.

2. Description of the Related Art

In semiconductor fabrication technologies, miniaturization of devices, including especially electrodes and wirings, is progressing rapidly in response to demand for reduction in circuit area size and high-performance operations. There are several methods for fabricating conductive layers defining electrodes and wirings. When they are formed on a compound semiconductor substrate, a technique called a lift-off method is generally employed. This is because compound semiconductor materials are weak for chemical or physical damage due to etching or milling processes. By employing a lift-off method, adverse influence on the underlayer located nearby can be reduced.

FIG. 1 illustrates a typical lift-off method for forming a conductive layer 2 on a semiconductor substrate 1. Two resist layers 3 and 4 with different photo-sensitivities are formed over the semiconductor substrate 1, and these resist layers are patterned so as to define an overhang resist structure (with an overhang cross section). The conductive layer 2 is formed on the semiconductor substrate 1 through the openings.

Although not shown in FIG. 1, the conductive layer 2 is also formed over the upper resist layer 4. The conductive layer 2 over the upper resist layer is removed in the lift-off step.

With a conventional lift-off method, two resist layers of different photo-sensitivities sensitive to g-lines (435 nm) are prepared. The resist layer 4 with a lower sensitivity is placed on the resist layer 3 with a higher sensitivity. The processing accuracy depends on the exposure wavelength and the sensitivity difference between the two layered resist materials. Accordingly, with this system, the opening size and the pitch of the conductive layer 2 are limited to about 2 µm. However, the current and future device size requires further miniaturization. To realize this requirement, studies are being made and research is being conducted of nano-processing techniques using i-lines (ultra-violet rays) with shorter wavelength than g-lines. See, for example, JP Laid-Open publications 6-5631A and 8-272107A.

By the way, there is not an ample choice of resist liquids (solvents) containing an i-line-sensitive photosensitizing agent, as compared with g-line-sensitive resist liquids. Even if the sensitivities of existing i-line-sensitive resist materials are different from each other, the structures of the resist solvents are similar to each other. For this reason, it is difficult to apply two types of i-line-sensitive resist layers with different sensitivities one directly on the other because, upon applying the upper resist layer, the lower resist layer dissolves into the upper resist liquid.

In JP 6-5631, an intermediate layer that is soluble in an alkaline developer is inserted between the lower i-line-sensitive resist layer and the g-line-sensitive resist layer so as prevent the lower and upper resist layers from mixing with each other.

However, inserting such an intermediate layer between the two resist layers is difficult. Even if the intermediate layer can be formed on the lower resist layer, the intermediate layer will quickly fuse during development of the upper resist layer. This leads to a concern that the upper and lower resist layers may be dissociated from each other.

In addition, as long as a g-line-sensitive resist is used for the upper resist layer, there is little promise for improvement of resolution. This makes it difficult to realize further miniaturization of a semiconductor device.

On the other hand, in JP 8-272107, two types of resist layers are applied one over the other, without inserting a dissolution blocking layer between the upper and lower resist layers. However, the inventors found through thorough studies that this structure can be available only when a cyclized rubber resin is used for the lower resist layer, and it is considerably difficult to form the layered structure if a non-rubber based resin is used for both the lower and upper resist layers.

Another known technique is to form a polymethyl glutaral imido (PMGI) underlayer over a semiconductor substrate, and to form a resist layer on the underlayer. The resist used in this technique generally contains a solvent (e.g., an organic solvent), a resin (e.g., a novolac resin), and a photosensitizing agent (sensitive to, for example, electron rays, g-lines, or i-lines). A predetermined area of the resist is exposed to irradiation of electron rays or i-lines, and the irradiated area is removed by development to form a resist pattern with an opening. Since PMGI is soluble in an alkaline solution, an alkaline developer is used to etch the PMGI underlayer. In this manner, a resist pattern with an overhang cross section can be formed.

Although PMGI has a good adhesiveness to silicon (Si), it is not so effective in adhering to a compound semiconductor whose major constituent is not silicon. For example, a III-V compound semiconductor contains a group III element, such as aluminum (Al), gallium (Ga), or indium (In), and a group V element, such as arsenic (As). The adhesiveness between the compound semiconductor substrate and the PMGI underlayer depends on the intermolecular force acting between them. Although the molecular attraction between silicon (Si) and PMGI is strong, that acting between a compound semiconductor substrate and PMGI is weak. Consequently, it is difficult to form a fine conductive pattern on a compound semiconductor substrate using this method.

From the viewpoint of miniaturization, a fine pattern could be formed on a compound semiconductor substrate, as well as on a silicon substrate, using argon fluoride (ArF) or Krypton fluoride (KrF). However, adhesiveness between a compound semiconductor substrate and a resist resin applicable to ArF or KrF laser exposure is insufficient from the viewpoint of intermolecular force. In addition, this method causes the system structure and the process control procedure to be complicated and expensive. Such a complicated and high-cost method may be applicable to a mass-produced product, such as a silicon-based substrate, but is unsuitable for a variety of small-lot productions, such as compound semiconductor substrates.

SUMMARY OF THE INVENTION

The present invention is conceived in view of the above-described problems in the prior art, and it is an object of the invention to provide a method for forming a conductive layer on a compound semiconductor substrate surface at improved precision of fine processing, using an overhang resist pattern consisting of two or more resist layers and defining an overhang cross section.

In one aspect of the invention, the method includes the steps of:

(a) forming a lower resist layer on a semiconductor substrate;
(b) forming a water soluble resin layer over the lower resist layer;
(c) performing heat treatment so as to produce a cross-linking layer between the lower resist layer and the water soluble resin layer, the cross-linking layer being insoluble in an organic material;
(d) applying a resist containing a photosensitizing agent to form an upper resist layer over the cross-linking layer;
(e) irradiating the upper and lower resist layers by a beam through a photomask;
(f) removing a portion of the upper resist layer and a portion of the cross-linking layer to form an upper opening;
(g) removing a portion of the lower resist layer using a developer to form a lower opening; and
(h) forming a conductive layer on the semiconductor substrate through the upper and lower openings.

The layered resist structure formed by this method is applicable to miniaturization processes using various types of general-purpose resists.

Preferably, at least the upper resist layer contains a photosensitizing agent sensitive to i-lines.

Using an i-line-sensitive resist material for the upper resist layer greatly contributes to miniaturization of a semiconductor device.

With the above-described method, processing precision is improved in forming a fine pattern of a conductive layer on a compound semiconductor surface using a multi-layer resist pattern with an overhang cross section, as compared with the conventional techniques.

BRIEF DESCRIPTION OF THE DRAWINGS

Other objects, features, and advantages of the present invention will become more apparent from the following detailed description when read in conjunction with the accompanying drawings, in which.

DETAILED DESCRIPTION OF THE PREFERED EMBODIMENTS

Figure 1:
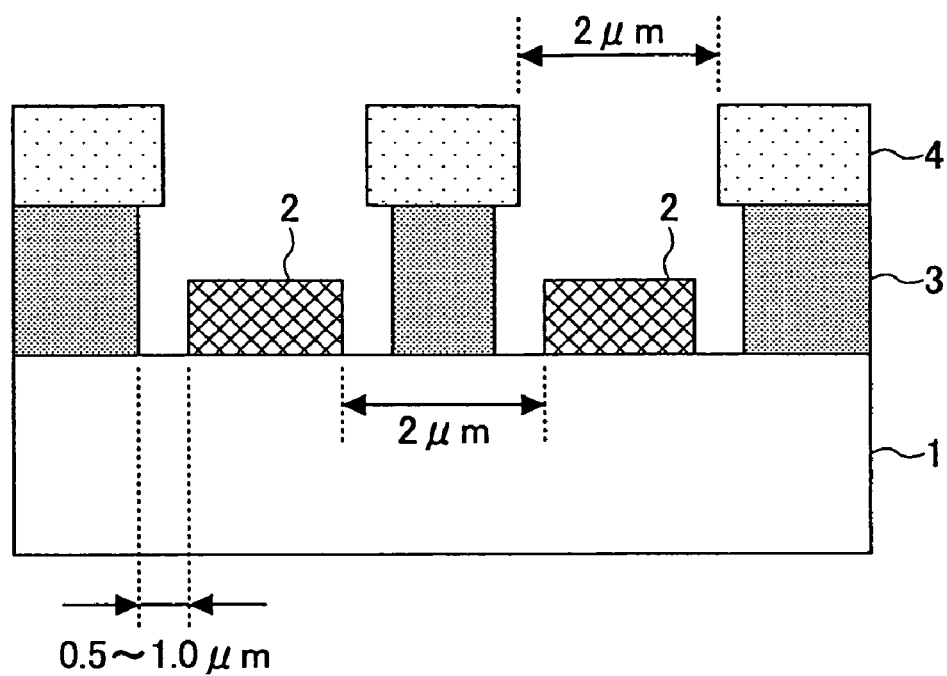
FIG. 1 is a schematic cross-sectional view illustrating an overhang resist pattern formed over a compound semiconductor substrate.

The preferred embodiments of the present invention are described below in conjunction with the attached drawings.

Prior to describing actual embodiments, the outline of the present invention is described.

With the present invention, a water soluble polymer is formed over the lower resist layer, and heat treatment is applied to produce a cross-linking layer insoluble in an organic material between the lower resist layer and the water soluble polymer layer. The cross-linking layer can prevent the upper and lower resist layers from mixing with or separating from each other. Consequently, an arbitrary type of i-line-sensitive resist can be used as the upper resist layer, and finer and more precise pattering can be implemented as compared with the conventional techniques. Because the cross-linking layer produced by heating the water soluble polymer is soluble in a developer, it is appropriately etched when the resist layers are developed. In this context, the "cross-linking layer" includes not only a layer with molecules of the upper and lower resists and the water soluble resin bonding to each other, but also a layer with molecules mixed with each other thereby causing the solubility to change.

With the invention, it is unnecessary to use PMGI, which is less adhesive to a compound semiconductor substrate, for the lower resist layer, and an arbitrary material suitable for a compound semiconductor substrate can be selected. For example, a novolac resin, a cresol resin, or a polyvinyl phenol, which resin has good adhesiveness to a compound semiconductor substrate, can be used as the lower resist layer.

In a preferred example, the lower resist layer does not contain a photosensitizing agent. As long as the entirety of the lower resist layer can be etched by a developer, an opening pattern can be formed in the lower resist layer without making use of photosensitivity. Accordingly, a resin material not containing a photosensitizing agent is used. Of course, a resin material containing a photosensitizing agent may be used. In this case, the photosensitivity of the resist is weakened by a thermal process performed after the coating of the lower resist. There is a wide range of choice for the lower resist layer.

The water soluble resin layer is made of, for example, polyvinyl alcohol (PVA), which material is suitable for producing a satisfactory cross-linking layer at the boundary with the lower resist layer.

The upper resist layer may have a photosensitivity different from that of the lower resist layer. For example, the upper resist is of a positive type, while the lower resist is of a negative type. With a positive resist, the exposed portion is removed after development, and the exposure beam is guided into the recessed area. With a negative resist, the exposed area remains after development under normal conditions. However, if the photosensitivity is reduced by heat treatment, the entire resist can be removed after development regardless of whether exposure is carried out. An opening of desired size and shape can be formed in the lower resist layer by etching or developing the lower resist under application of a developer through the upper opening formed in the upper resist layer.

During the formation of the upper resist layer, an unnecessary portion of the water soluble resin layer that has not contributed to cross-linking with the lower resist layer is removed by the organic solvent contained in the resist, or rinsed away using an organic flux or water. If the non-contributive water soluble resin exists at or near the boundary between the cross-linking layer and the upper resist layer, adhesion between these two layers is degraded. By removing the unnecessary portion of the water soluble polymer by the organic solvent contained in the resist or using an organic flux or water, a layered resist structure with satisfactory adhesion can be fabricated.

The solvent contained in the upper resist may have a characteristic exhibiting a low solubility with respect to the cross-linking layer in a high-temperature range, rather than in a low-temperature range, of a heat treatment. Alternatively, the solvent of the upper resist may have a solubility profile that shows a lower solubility in a high-temperature range with respect to the non-contributive portion of the water soluble resin, rather than in a low-temperature range of the heat treatment. By using a solvent with temperature-dependent variable solubility, the unnecessary portion (or the non-contributive portion) of the water soluble resin can be removed, while maintaining the cross-linking layer, and the upper resist layer can be formed appropriately. The solvent contained in the resist is, for example, MMP thinner or 2-heptanone.

Alternatively, a rinsing step may be performed prior to the formation of the upper resist layer to remove the unnecessary portion of the water soluble resin non-contributive to the cross-linking. In this case, a liquid with a temperature-independent solubility may be used for the rinsing. A typical example of such liquid is water. The rinsing step can prevent an undesirable structure (that is, the degraded water soluble resins) from remaining between the cross-linking layer and the upper resin layer, and accordingly, and can prevent the upper resist layer from pealing.

The time duration for immersing the lower resist layer in a developer may be adjusted to regulate the size of the lower opening. Because the etching rate of the lower resist that is little subjected to change in solubility or chemical polarity during a high-temperature thermal process or exposure is slow, the lower opening size can be controlled precisely.

Actual examples are now described below.

First Embodiment

Figure 2A:
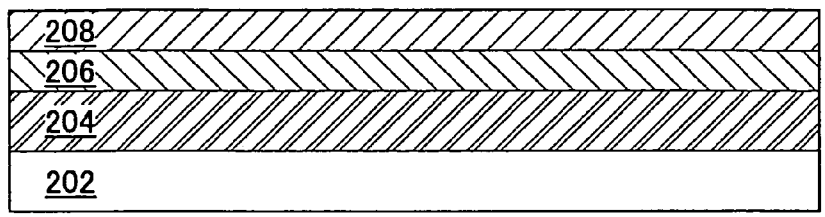
FIG. 2A through FIG. 2G illustrate a conductive layer fabrication process according to the first embodiment of the invention.

FIG. 2A through FIG. 2G illustrate the major part of a conductive layer fabrication process according to the first embodiment of the invention. In FIG. 2A, a compound semiconductor substrate is prepared. In this example, the compound semiconductor substrate includes a GaAs semi-insulating substrate 202, a buffer layer 204, an InGaAs channel layer (high mobility layer) 206, and an AlGaAs electron donation layer 208 arranged in this order from the bottom. Action regions and inactive regions are defined in the compound semiconductor substrate by oxygen implantation in prescribed areas. The following description is directed mainly to the process performed in the active regions.

Figure 2B:
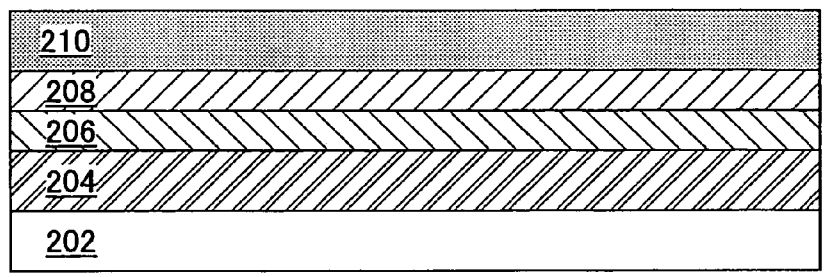

In FIG. 2B, a lower resist layer 210 is formed on the top face of the compound semiconductor substrate. In this example, ZPN-1150 manufactured by Zeon Corporation is applied onto the substrate by spin coating up to a thickness of 1000 nm, and heated at about 140° C. for 90 seconds. The lower resist layer 210 contains a negative resist photosensitive to g-lines and i-lines. The exposed portion is to remain, while the unexposed portion is removed, after development. Such photosensitivity may be reduced by the thermal process during the formation of the lower resist layer or a high-temperature thermal process described below. After the thermal process, the lower resist layer 210 tends to be removable by a developer regardless of implementation of beam exposure. The lower resist layer 210 may include a novolac resin, a polyvynil phenol resin, and a cresol resin. These resins have a good adhesion to a compound semiconductor substrate, and are suitable for processing a compound semiconductor substrate.

Figure 2C:
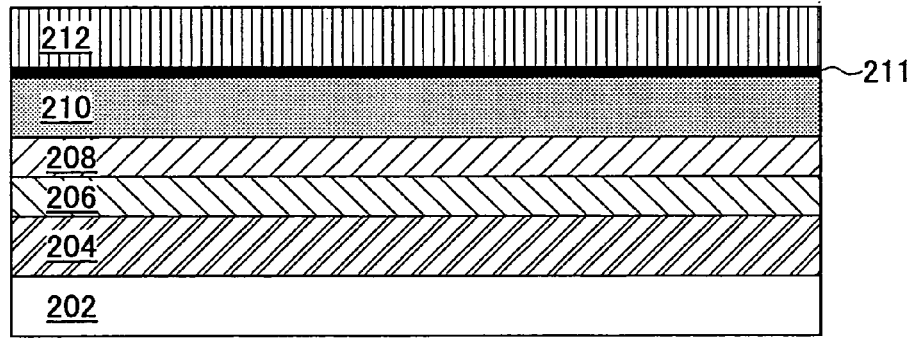

In FIG. 2C, a water soluble resin layer 212 made of polyvinyl alcohol (PVA) is formed over the lower resist layer 210 by spin coating up to a thickness of about 20 nm. By heating at 140° C. for 90 seconds, a dissolution blocking layer (or a cross-linking layer) 211 is produced at or near the boundary between the lower resist layer 210 and PVA 212. The dissolution blocking layer 211 has a structure bridging or cross-linking the resin in the lower resist layer 210 and the PVA layer 212, and it is insoluble in an organic solvent. To this end, the dissolution blocking layer 211 may be called a cross-linking layer 211.

Figure 2D:
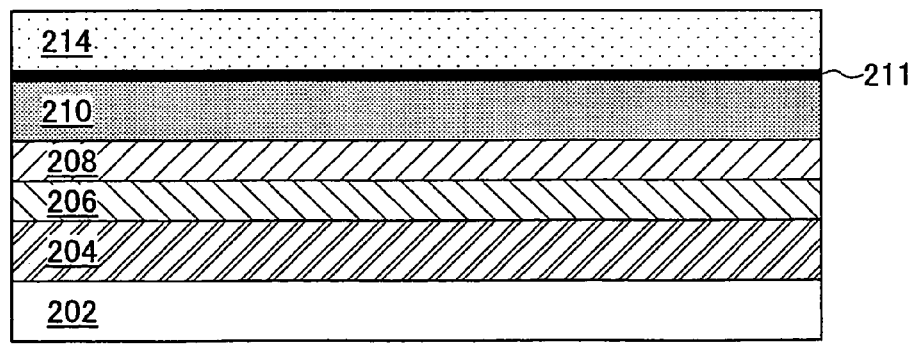

In FIG. 2D, an upper resist layer 214 is formed over the PVA layer 212 by spin coating up to a thickness of 1000 nm using, for example, IP 3100 (MM) manufactured by Tokyo Ohka Kogyo Co., Ltd. This resist contains a MMP thinner as a solvent. A part of the PVA (referred to as a "degraded PVA") layer 212 non-contributive to the bridge formation of the cross-linking layer 211 has been degraded in organic-insolubility through the heating process, and therefore, it dissolves in an organic solvent (MMP thinner in this example) unlike the originally applied PVA. On the other hand, the cross-linking layer 211 is organic insoluble. Accordingly, upon application of the upper resist layer 214, the degraded PVA layer 212 over the cross-linking layer 211 is dissolved and removed.

Figure 5:
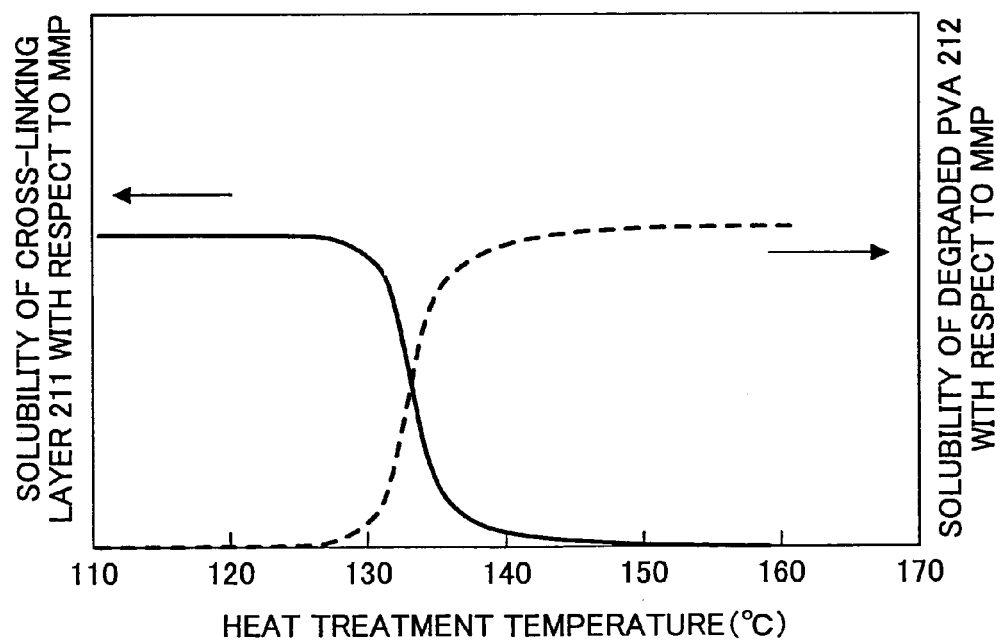
FIG. 5 is a graph showing the temperature-dependent solubility of a cross-linking layer and degraded PVA with respect to a MMP solvent.

FIG. 5 is a graph showing the solubility of the cross-linking layer 211 with respect to MMP thinner (the left-hand side vertical axis) plotted by the solid line as a function temperature, and that of the degraded PVA layer 212 with respect to MMP (right-hand side vertical axis) plotted by the hashed line as a function of temperature. Although other process parameters, such as time and pressure, may also affect the solubility, it is assumed that temperature dominantly influences the solubility. The solubility increases toward the top of the vertical axis and decreases toward the bottom although no actual values are indicated. The "solubility of the cross-linking layer" is represented not only by complete breakup of the bridging structure, but also defectiveness of the cross-linking layer causing the lower resist layer 210 to dissolve. In addition, the solubility of the cross-linking layer is estimated after the degraded PVA non-contributive to cross-linking has been removed.

As shown in the graph, the cross-linking layer 211 exhibits a high solubility with respect to the MMP thinner below 130° C., but the solubility falls abruptly above 130° C. and is considerably low above 140° C. In contrast, the solubility of the degraded PVA with respect to the MMP thinner is extremely low below 130° C., but it leaps above 130° C. and stays constantly high above 140° C. Accordingly, by using IP 3100 (MM) in the upper resist layer 214 in combination with a thermal process at about 140° C., the degraded PVA layer 212 is removed by dissolution, while maintaining the cross-linking layer 211. In this manner, the first embodiment makes use of the contrasting temperature-dependent solubility profiles of the cross-linking layer 211 and the degraded PVA 212 layer with respect to the MMP thinner, which profiles are inverted on reaching around 130-140° C., as well as the fact that the cross-linking layer has little MMP solubility above 140° C.

Returning to FIG. 2D, the degraded PVA layer 212 is removed, while maintaining the cross-linking layer 211, and heat treatment is performed at 110° C. for 90 seconds to complete the upper resist layer 214. In this example, the upper resist layer 214 is of a positive type photosensitive to i-lines. Accordingly, the exposed portion of the upper resist is to be removed through development.

Figure 2E:
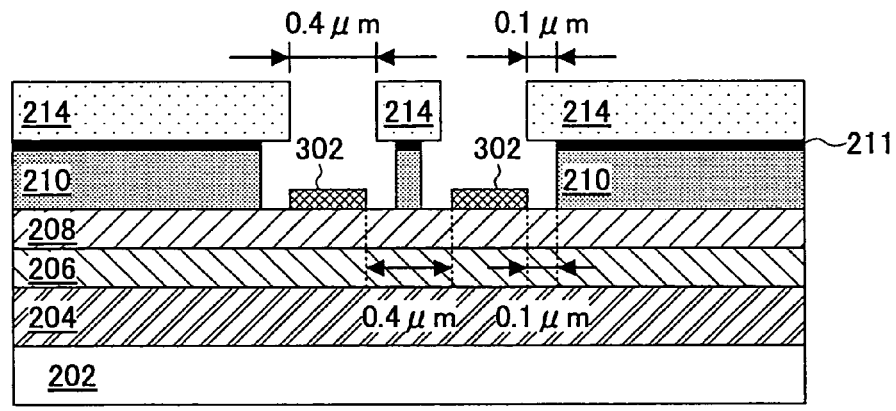

In FIG. 2E, the upper and lower resist layers 214 and 210 are illuminated by i-line exposure beams through a photomask. A portion of the upper resist layer 214 is removed by development, and the cross-linking layer 211 is exposed. The irradiation energy of the i-line exposure beam is about 300 mJ. The photomask has a prescribed pattern defining the conductive layer to be formed on the compound semiconductor substrate. Although the upper resist layer 214 used in this example is of a positive type, a negative resist may be used. Depending of the photosensitive type, the mask pattern of the photomask is inverted. Developer is, for example, 2.38% tetra methyl ammonium hydride (TMAH). Since the photosensitivity of the negative-type lower resist layer 212 has been weakened through the thermal process, the entirety of it is soluble in the developer. However, it should be noted that the rate of dissolution is slow in a direction spreading from the edge of the upper opening. For example, after 30-second immersion in the developer, 0.1 µm of resist is etched.

The upper resist layer 214 is quickly patterned to form the upper opening based on the effective photosensitivity, while the lower resist layer 210 is gradually etched by the developer based on the ineffective negative type photosensitivity. In this context, "effective photosensitivity" is a characteristic where the removability of the resist by the developer depends on whether the resist is subjected to exposure beams, and "ineffective photosensitivity" is a characteristic where the removability of the resist does not depend on presence or absence of exposure. By adjusting the time for immersing the lower resist layer 210 in the developer, the size of the lower opening to be formed in the lower resist layer 210 can be precisely controlled. For example, the opening size of the upper resist layer 214 is set to about 0.4 µm, and that of the lower resist layer 210 is set to about 0.6 µm.

In this manner, a multi-layer resist pattern consisting of the two resist layers 210 and 214 and with an overhang cross-sectional shape is defined on the compound semiconductor substrate, as illustrated in FIG. 2E. Then, a conductive layer 302 is formed on the exposed surface of the compound semiconductor substrate by high vacuum deposition through the opening. The conductive layer 302 is made of, for example, gold (Au) and germanium (Ge), and has a thickness of about 220 nm (20 nm AuGe/200 nm Au). Although not shown in FIG. 2E, the conductive layer is also formed over the upper resist layer 214 in this step.

Figure 2F:
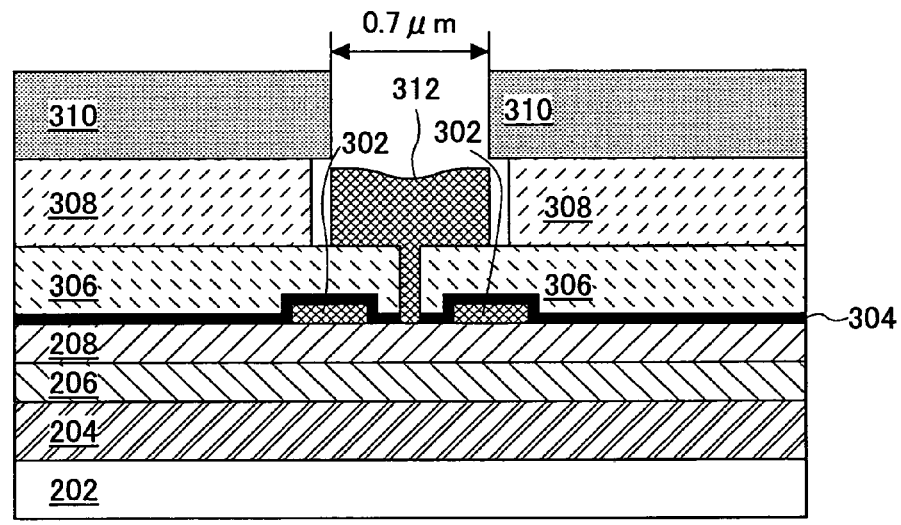

In FIG. 2F, the entire substrate is immersed in a heated organic solvent to remove the unnecessary portion of the conductive layer 302, together with the upper and lower resist layers 210 and 214, using a lift-off method. Then, a thermal process is performed at 350° C. for 5 minutes for alloying the conductive layer to form an ohmic electrode 302.

Then, a silicon nitride (SiN) layer 304 with a thickness of about 20 nm is formed over the entire surface of the substrate by plasma CVD. Then, a lower resist layer 306 is formed over the SiN layer 304 by spin coating up to a thickness of 300 nm. The lower resist 306 is, for example, an electron beam resist of a positive type. The lower resist layer 306 is hardened by five-minute heat treatment at about 180° C. Then, an intermediate layer 308 with a thickness of about 500 nm is formed over the lower resist layer 306 by spin coating. The intermediate layer 308 contains an alkali soluble resin consisting of polymethyl glutaral imido (PMGI). The intermediate layer 308 is hardened by a three-minute heat treatment at about 180° C. Then, an upper resin layer 310 with a thickness of about 300 nm is formed over the PMGI intermediate layer 308 by spin coating. The upper resist layer 310 contains, for example, an electron beam resist of a positive type consisting of polystyrene polymer, and is hardened by a three-minute heat treatment at about 180° C.

Then, an over-gate pattern with a dimension of 0.7 µm in an electric current direction is delineated on the upper resist layer 310 by electron beam lithography. The electron beam pattern is then developed to form an upper opening so as to expose the intermediate layer 308. The exposed portion of the intermediate layer 308 is etched by an alkaline developer, such as 2.38% TMAH, to form a lower opening which is 0.4 µm longer than the upper opening in the current direction. The PMMA lower resist layer 306 is exposed in the lower opening. A pattern with a dimension of 0.1 µm in the current direction is then delineated in the exposed PMMA layer 306 by electron beam lithography, and the pattern is developed to expose the SiN layer 304. The developer is, for example, an MIBK/IPA mixture. Then, the SiN layer 304 is etched by dry etching using, for example, SF₆ gas, and finally, the electron donation layer 208 is exposed. A conductive layer 312 is formed via the openings formed in the layers 304, 306, 308, and 310 to define a gate electrode. The conductive layer 310 consists of a 10-nm thickness titanium (Ti) layer, 10-nm thickness platinum (Pt) layer, and 300-nm gold (Au) layer, formed by vapor deposition. Although not illustrated in FIG. 2F, the entire surface of the upper resist layer 310 is covered with the conductive layer by the vapor deposition.

Figure 2G:
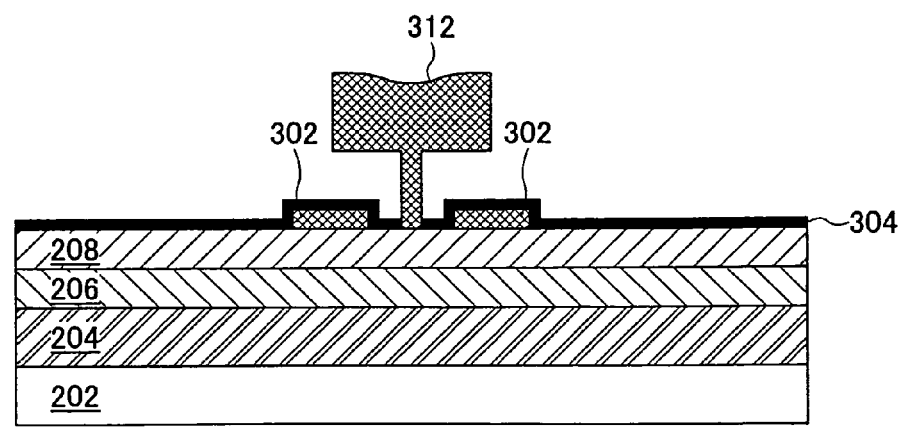

In FIG. 2G, unnecessary layers are removed by lift-off, and a T-shaped gate electrode 312 is formed over the ohmic electrodes 302. The T-shaped gate electrode 312 is called a "mushroom gate electrode" because of its shape.

With the method of the first embodiment, the pitch of the ohmic electrodes 302 (that is, the interval between the adjacent ohmic electrodes 302) can be sufficiently narrowed, and it is advantageous for miniaturization of the device structure as compared with the conventional self-alignment method in which the pitch depends on the over-gate length. With this method, the device can have a gate electrode with a sufficiently large over-gate region (the top portion of the T-shaped electrode) without forming a recess region in the low-resistance layer on the semiconductor surface prior to forming the gate electrodes, as in the conventional self-aligned device.

Second Embodiment

Figure 3A:
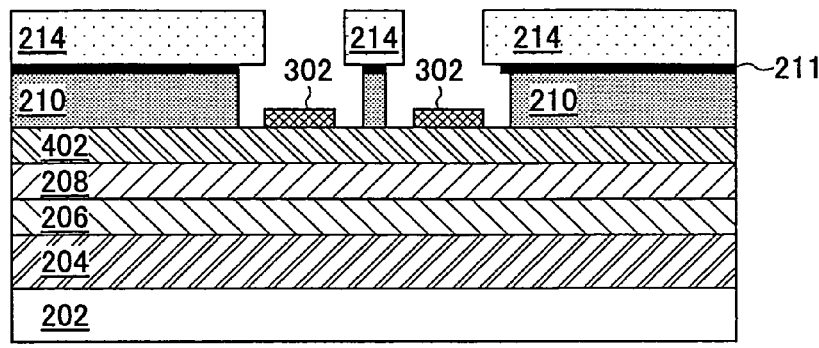
FIG. 3A through FIG. 3D illustrate a conductive layer fabrication process according to the second embodiment of the invention.

FIG. 3A through FIG. 3D illustrate a conductive layer fabrication process according to the second embodiment of the invention. In the second embodiment, the conductive layer 302 is formed on a GaAs low-resistance layer 402. The steps reaching the step shown in FIG. 3A are the same as those explained in conjunction with FIG. 2A through FIG. 2D in the first embodiment. Although, in the second embodiment, the interval between the adjacent conductive layers 302 is set wider than 0.4 µm, this dimension is only an example and any appropriate interval may be selected. The conductive layers 302 are formed on the GaAs compound semiconductor layer 402 through the openings formed in the double-layer resist pattern with an overhang cross-section. Although not shown in FIG. 3A, the entire surface of the upper resist layer 214 is covered with the conductive layer 302. The conductive layer 302 is made of, for example, AuGe (20 nm)/Au (200 nm) by vapor deposition in a high vacuum atmosphere. After the vapor deposition, the entire substrate is immersed in a heated organic solvent, and lift-off is carried out to remove an unnecessary portion of the conductive layer together with the overhang resist pattern.

Figure 3B:
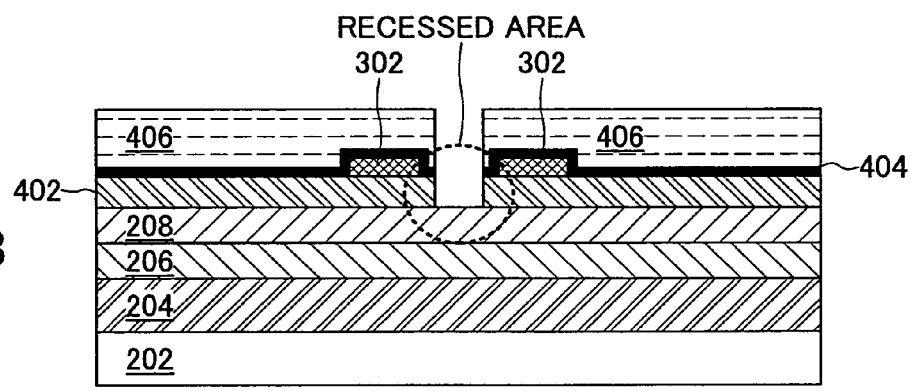

In FIG. 3B, the conductive layers 302 are alloyed by heat application, and ohmic electrodes 302 are formed. Then, a silicon nitride (SiN) layer 404 with a thickness of about 20 nm is formed over the entire surface of the substrate by plasma CVD. Then, a resist layer 406 suitable for electron beam lithography is formed over the SiN layer 404 by spin coating up to a thickness of 300 nm. The electron beam resist layer 406 is, for example, made of ZEP 520. An opening pattern corresponding to a 0.4 µm length is delineated in the resist layer 406 by electron beam lithography. The opening pattern is developed to form an opening for exposing the SiN layer 404. Then, the SiN layer 404 is etched by dry etching using, for example, $SF_6$ gas, and the GaAs low-resistance layer 402 is exposed. The exposed portion of the GaAs low-resistance layer 402 is dry-etched using $SiCl_4$ gas so as to expose the electron donation layer 208. In this manner, a recess region with a dimension of 0.4 µm and reaching the electron donation layer 208 can be formed.

Figure 3C:
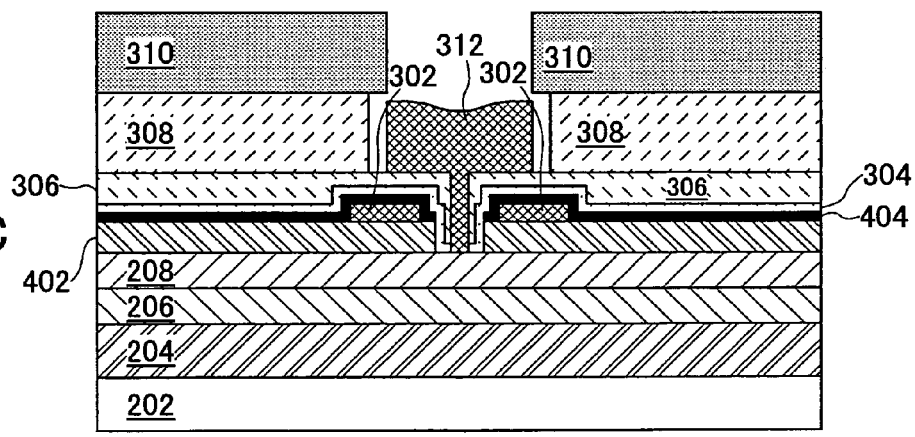

In FIG. 3C, the resist layer 406 is removed, and another silicon nitride (SiN) layer 304 is formed over the entire surface. Then, a lower resist layer 306 consisting of PMMA, an intermediate layer 308 consisting of PMGI, and an upper resist layer 310 consisting of polystyrene polymer are formed successively. An over-gate pattern with a dimension of 0.7 µm in an electric current direction is delineated on the upper resist layer 310 by electron beam lithography. The electron beam pattern is then developed to form an upper opening so as to expose the intermediate layer 308. The exposed portion of the intermediate layer 308 is etched by an alkaline developer, such as 2.38% TMAH, until the PMMA lower resist layer 306 is exposed. A pattern with a dimension of 0.1 µm in the current direction is delineated in the exposed PMMA layer 306 by electron beam lithography, and the corresponding portion of the SiN layer 304 is exposed by development. Then, the SiN layer 304 is etched by dry etching using, for example, $SF_6$ gas, to expose the electron donation layer 208.

A conductive layer 312 is formed via the openings formed in the layers 304, 306, 308, and 310 to define a gate electrode. The conductive layer 312 consists of a 10-nm thickness titanium (Ti) layer, 10-nm thickness platinum (Pt) layer, and 300-nm gold (Au) layer, formed by vapor deposition. Although not illustrated in FIG. 2F, the entire surface of the upper resist layer 310 is covered with the conductive layer 312 by the vapor deposition.

Figure 3D:
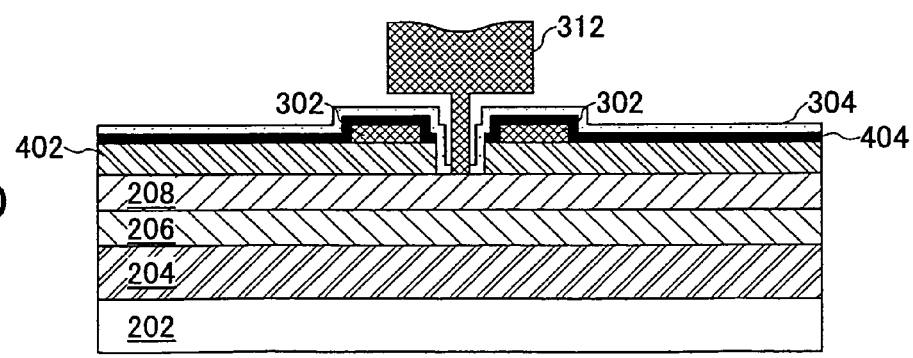

In FIG. 3D, unnecessary layers are removed by lift-off, and a T-shaped gate electrode 312 is formed over the ohmic electrodes 302 and the low-resistance layer 402.

With the method of the second embodiment, the T-shaped gate electrode can be formed between two adjacent conductive layers (ohmic electrodes) 302 arranged at a narrow pitch and in the recess formed in the low-resistance layer 402. This method is advantageous in miniaturization of device structure.

Third Embodiment

In the first embodiment, the photosensitivity of the lower resist layer 210 is weakened by heat treatment (at 140° C.) during the generation of the dissolution blocking layer (cross-linking layer) 211 between the lower resist layer 210 and the water soluble resin layer 212 (see FIG. 2C and FIG. 2D). In this case, the properties of the lower resist layer 210 are changed so as for it to be soluble in a developer because the photosensitizing agent (of a negative type in the first embodiment) contained in the resist is dissolved by heating above 120° C. However, another type of photosensitizing agent that does not lose the photosensitivity even if heated at a temperature for generating the cross-linking layer may be used.

In the third embodiment, a resist containing a heat-stable photosensitizing agent is used to form the lower resist layer.

Figure 4:
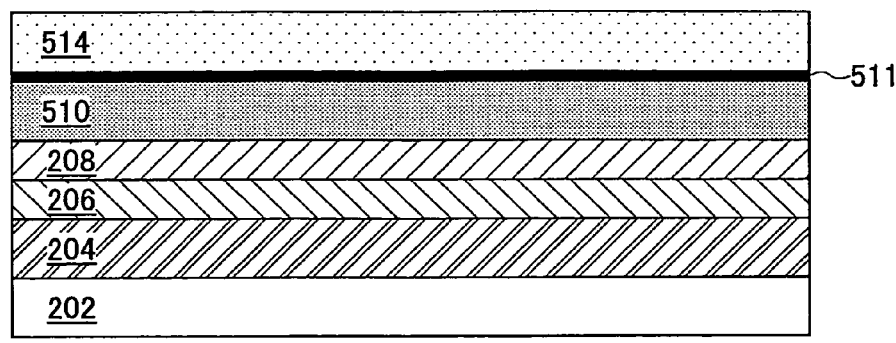
FIG. 4 is a schematic cross-sectional view illustrating a layered resist structure according to the third embodiment of the invention.

FIG. 4 is a cross-sectional view of the resist structure formed over the compound semiconductor substrate. A water soluble resin layer (e.g., a PVA layer) is applied onto a lower resist layer 510 containing a heat-stable photosensitizing agent. A dissolution blocking layer (cross-linking layer) 511 is formed by heat treatment. An unnecessary portion of the water soluble resin non-contributive to the formation of the cross-linking layer 511 is removed, and an upper resist layer 514 is formed over the dissolution blocking layer 511. Both the upper resist layer 514 and the lower resist layer 510 have effective photosensitivities to an exposure bema (especially, to i-lines). The photosensitivity of the upper resist layer 514 is less than that of the lower resist layer 510. The photosensitivity is of either a positive type or a negative type; however, the upper and lower resist layers 514 and 510 need to have the same type of photosensitivity. The cross-linking layer 511 effectively prevents the upper and lower resist layers 514 and 510 from mixing with each other. The degraded PVA that does not contribute to the generation of the cross-linking layer 511 is removed upon applying the upper resist material, and reliable adhesion is guaranteed between the upper and lower resist layers 514 and 510. Then the upper and lower resist layers 514 and 510 are irradiated by an exposure beam with a cross-sectional profile defining a desired pattern, and subsequent development is carried out to form a double-layer resist structure with an overhang cross-sectional shape making use of the photosensitivity difference. Using this resist structure, a conductive layer is formed on the compound semiconductor substrate in the manner already described above.

Fourth Embodiment

In the first embodiment, a resist containing an MMP thinner as a solvent is used to form the upper resist layer 214. The MMP thinner is useful to remove the degraded PVA, while maintaining the cross-linking layer 211. In the fourth embodiment, the MMP thinner based resist is replaced by PHI-32A8 containing 2-heptanone, manufactured by Sumitomo Chemical Co., Ltd., to form the upper resist layer.

Figure 9A:
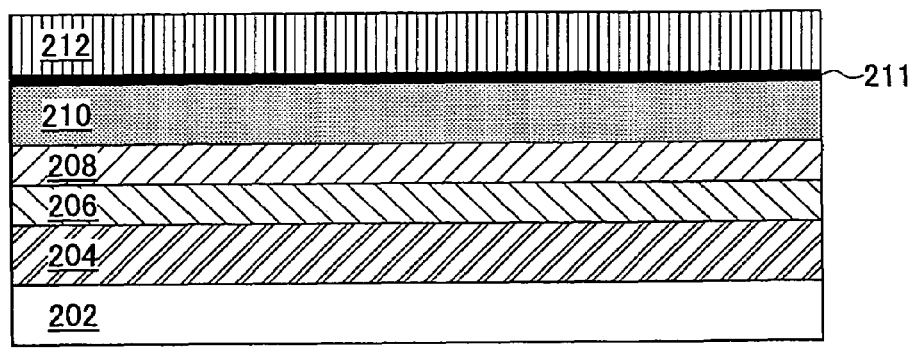
FIG. 9A through FIG. 9C illustrate a conductive layer fabrication process according to the fourth embodiment of the invention.
Figure 9B:
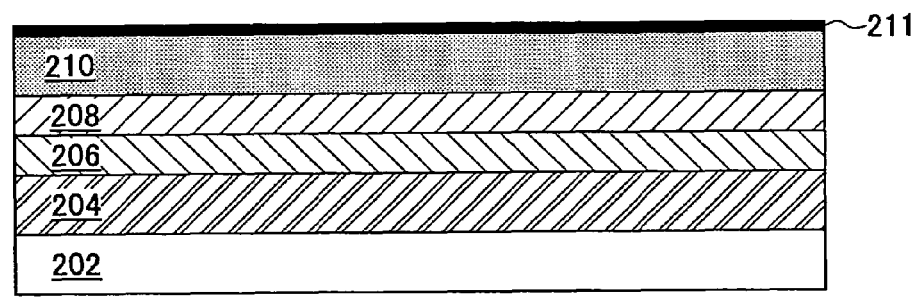
Figure 9C:
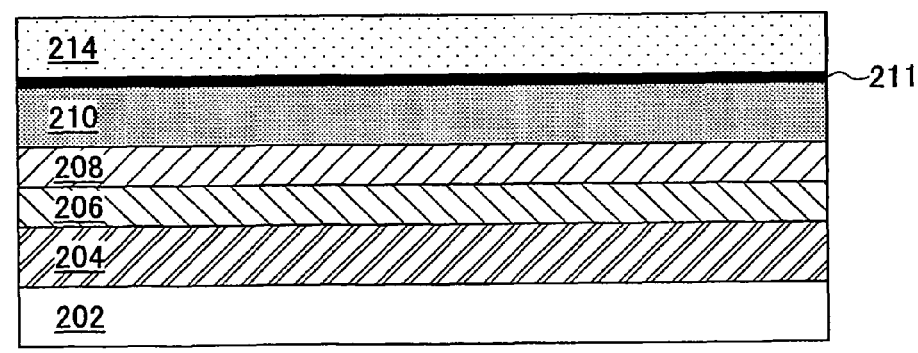

FIG. 9A through FIG. 9C illustrate a part of the conductive layer fabrication process according to the fourth embodiment of the invention. The structure shown in FIG. 9A is the same as that illustrated in FIG. 2C. That is, a cross-linking layer 211 is generated at the boundary between the lower resist layer 210 and PVA resin layer 212.

In FIG. 9B, the structure shown in FIG. 9A is water rinsed to remove the degraded PVA that does not contribute to the generation of the cross-linking layer 211.

Figure 6:
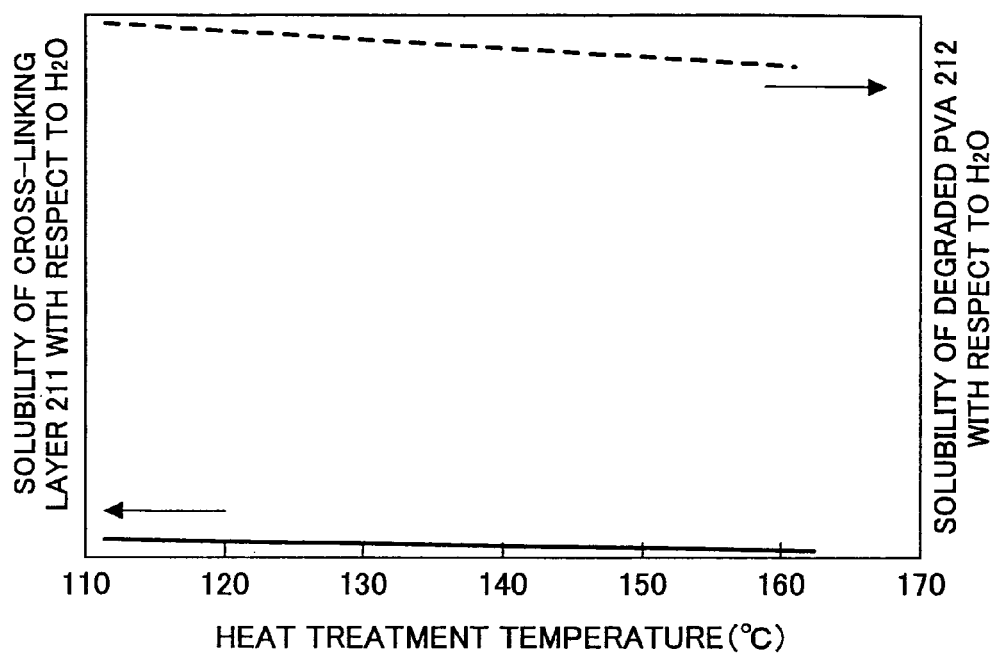
FIG. 6 is a graph showing the temperature-dependent solubility of a cross-linking layer and degraded PVA with respect to water.

FIG. 6 is a graph showing the water solubility of the cross-linking layer 211 and the degraded PVA, as a function of heat-treatment temperature. The solid line represents the water solubility of the cross-linking layer 211 (the left-hand side vertical axis), and the dashed line represents the water solubility of the degraded PVA (the right-hand side vertical axis). As is clearly shown in the graph, the degraded PVA has a high solubility with respect to water, regardless of temperature. This means that the water soluble characteristic of PVA 212 is not lost even after the heat treatment. In contrast, the solubility of the cross-linking layer 211 with respect to water is very low regardless of temperature. Accordingly, the degraded PVA 212 is dissolved and removed by water rinsing, while the cross-linking layer 211 remains with little dissolution. It should be noted that the cross-linking layer 211 exhibits a low water-solubility even below 140° C. of heat treatment. This means that the lower resist layer 210 does not dissolve in water even if the generation of the cross-linking layer 211 is insufficient.

In FIG. 9C, an upper resist layer 214 is formed at 140° C. over the cross-linking layer 211 using PFI-32A8 manufactured by Sumitomo Chemical Co., Ltd.

Figure 7:
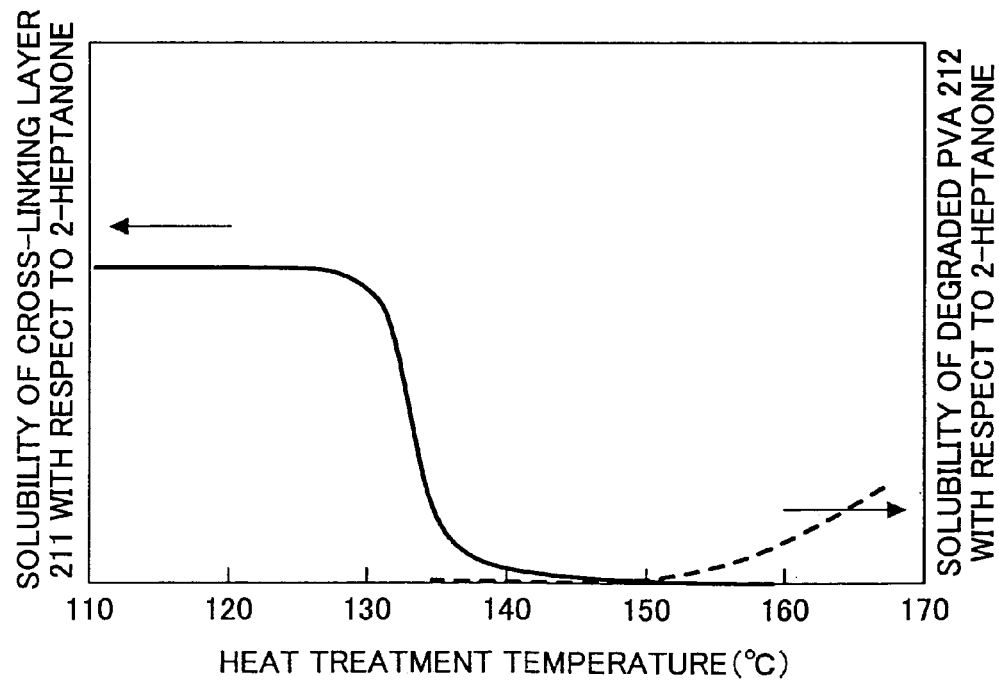
FIG. 7 is a graph showing the temperature-dependent solubility of a cross-linking layer and degraded PVA with respect to 2-heptanone.
Figure 8:
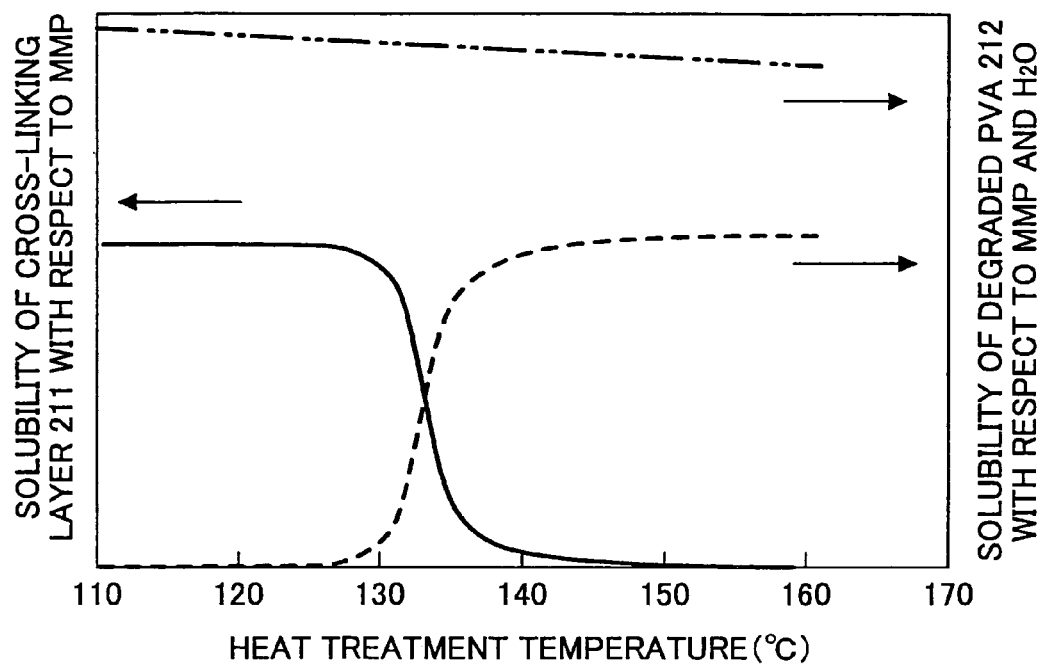
FIG. 8 is a graph showing the temperature-dependent solubility of a cross-linking layer with respect to MMP, together with the temperature dependent solubility of degraded PVA with respect to MMP and water.

FIG. 7 is a graph showing the solubility of the cross-linking layer 211 and the degraded PVA, as a function of heat-treatment temperature. The solid line represents the solubility of the cross-linking layer 211 with respect to 2-heptanone (the left-hand side vertical axis), and the dashed line represents the solubility of the degraded PVA with respect to 2-hepatnone (the right-hand side vertical axis). There is no big difference between the MMP thinner (FIG. 5) and 2-heptanone (FIG. 7) in solubility of the cross-linking layer 211. However, the degraded PVA is hard to dissolve in 2-heptanone, as indicated by the dashed line in FIG. 7. FIG. 8 is a graph of a combination of FIG. 5 and FIG. 6. It is proved from the graph that the solubility of degraded PVA with respect to water is the greatest, as indicated by the double-dashed line in FIG. 8.

Returning to FIG. 7, the cross-linking layer 211 does not dissolve in 2-heptanone at or above 140° C., and therefore, PFI-32A8 can be used to form the upper resist layer 214 over the cross-linking layer 211 without influence on the structure of the cross-linking layer 211.

In this example, the degraded PVA is rinsed and removed by water; however the rinsing solution is not limited to water and any suitable solution may be used in place of water as long as it can dissolve PVA 212, while showing little dissolution of the cross-linking layer 211.

When IP 3100 (MM) is used for the upper resist layer 214, as in the first embodiment, water rinsing is unnecessary to remove the degraded PVA. In contrast, water rinsing is required when using PFI-32A8 as in the fourth embodiment. Other than IP 3100 (MM) and PFI-32A8, any suitable solvent may be used to form the upper resist layer 214 as long as it has different dissolutions for the cross-linking layer and/or the degraded PVA depending on temperature.

This patent application is based on and claims the benefit of the earlier filing date of Japanese Patent Application No. 2005-105227 filed Mar. 31, 2005, the entire contents of which are incorporated herein by reference.

What is claimed is:

1. A conductive layer fabrication method comprising the steps of:
   forming a lower resist layer on a semiconductor substrate;
   forming a water soluble resin layer over the lower resist layer;
   performing heat treatment so as to produce a cross-linking layer between the lower resist layer and the water soluble resin layer, the cross-linking layer being insoluble in an organic material;
   applying a resist containing a photosensitizing agent to form an upper resist layer over the cross-linking layer;
   irradiating the upper and lower resist layers by a beam through a photomask;
   removing a portion of the upper resist layer and a portion of the cross-linking layer through development to form an upper opening;
   removing a portion of the lower resist layer using a developer to form a lower opening; and
   forming a conductive layer on the semiconductor substrate through the upper and lower openings.

2. The method of claim 1, wherein the semiconductor substrate is a compound semiconductor substrate.

3. The method of claim 1, wherein at least one of the lower and upper resist layers contains a photosensitizing agent sensitive to i-lines.

4. The method of claim 1, wherein the lower resist layer is made of at least one of a novolac resin, a cresol resin, and a polyvinyl phenol resin.

5. The method of claim 1, wherein the lower resist layer does not contain a photosensitizing agent.

6. The method of claim 1, wherein the water soluble resin is made of polyvinyl alcohol.

7. The method of claim 1, wherein the lower resist layer contains a photosensitizing agent, and wherein the photosensitivity of the lower resist layer is weakened by a second heat treatment performed after said heat treatment.

8. The method of claim 1, wherein the upper resist layer has a photosensitivity different from that of the lower resist layer.

9. The method of claim 1, wherein a portion of the water soluble resin that does not contribute to generation of the cross-linking layer is removed during the formation of the upper resist layer by an organic solvent contained in the upper resist layer or a separate organic solvent.

10. The method of claim 1, wherein a solubility of the cross-linking layer in an organic solvent contained in the upper resist layer is lower in a higher temperature range than in a lower temperature range of the heat treatment.

11. The method of claim 9, wherein a solubility of said portion of the water soluble resin that does not contribute to generation of the cross-linking layer with respect to the organic solvent contained in the upper resist layer or the separate organic solvent is greater in a higher temperature range than in a lower temperature range of the heat treatment.

12. The method of claim 10 or 11, wherein the organic solvent contained in the upper resist layer is MMP thinner.

13. The method of claim 1, wherein said portion of the water soluble resin that does not contribute to the cross-linking is removed by a solvent having a temperature-independent solubility.

14. The method of claim 1, wherein said portion of the water soluble resin that does not contribute to the cross-linking is removed by water.

15. The method of claim 1, wherein a dimension of the lower opening is regulated by adjusting a time for immersing the lower resist layer in the developer.

* * * * *